United States Patent [19]

Hughes et al.

[11] 4,266,007
[45] May 5, 1981

[54] MULTILAYER PRINTING PLATES AND PROCESS FOR MAKING SAME

[75] Inventors: Norman E. Hughes, Landenberg, Pa.; Bernard J. Scheve, Wilmington, Del.

[73] Assignee: Hercules Incorporated, Wilmington, Del.

[21] Appl. No.: 68,833

[22] Filed: Aug. 22, 1979

Related U.S. Application Data

[63] Continuation-in-part of Ser. No. 917,999, Jun. 22, 1978, abandoned.

[51] Int. Cl.³ .............................................. G03C 5/00
[52] U.S. Cl. ...................................... 430/306; 430/18; 430/281; 430/285; 430/286
[58] Field of Search ................. 430/281, 306, 18, 285, 430/286

[56] References Cited

U.S. PATENT DOCUMENTS

| | | | |
|---|---|---|---|
| 2,760,863 | 8/1956 | Plambeck | 430/281 |
| 2,964,401 | 12/1960 | Plambeck | 430/281 |
| 2,993,789 | 7/1961 | Crawford | 430/281 |
| 3,157,505 | 11/1964 | Notley | 430/288 |
| 3,661,575 | 5/1972 | Notley | 430/275 |
| 3,858,510 | 1/1975 | Kai et al. | 430/285 |
| 3,960,572 | 6/1976 | Ibata et al. | 430/283 |
| 3,990,897 | 11/1976 | Zuerger et al. | 430/271 |

FOREIGN PATENT DOCUMENTS

| | | | |
|---|---|---|---|
| 847986 | 3/1977 | Belgium | 430/306 |
| 2641189 | 4/1977 | Fed. Rep. of Germany | 430/306 |

*Primary Examiner*—Won H. Louie, Jr.
*Attorney, Agent, or Firm*—Richard J. Sheridan; Robert Charles Beam

[57] ABSTRACT

Multilayer printing plates having layers with differing moduli are made by exposing through a photographic negative a plurality of liquid layers of different photopolymerizable compositions.

7 Claims, 1 Drawing Figure

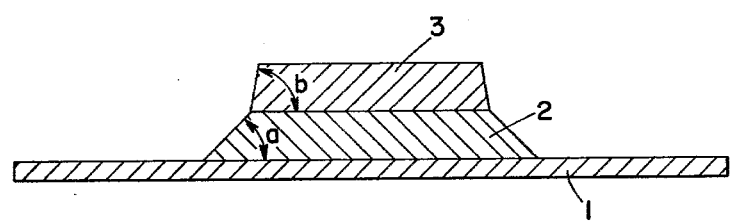

MULTILAYER PRINTING PLATES AND PROCESS FOR MAKING SAME

This is a continuation-in-part of applicant's copending application Ser. No. 917,999, filed June 22, 1978, now abandoned.

It is generally well recognized by those skilled in the art of printing that printing plates made from multiple layers having different hardness (e.g., soft underlayments used in combination with the harder materials commonly used as printing surfaces) can result in improved print quality. This is evident by the widespread use of foam backings for printing plates.

Printing plates produced from photopolymerizable materials are also well known in the printing art. See, for example, U.S. Pat. No. 2,760,863 to Plambeck. Attempts to combine the advantages of photopolymerization platemaking with those of soft backed plates led to the development of plates made from multiple layers of solid photopolymers as described in U.S. Pat. Nos. 2,993,789 to Crawford; 3,157,505 to Notley; and 3,990,897 to Zuerger et al. While these multilayer solid plates have advantages, they nevertheless suffer from several drawbacks. Frequently, adhesives are required to join the solid photopolymer layers together, and, since the soft base is not an integral part of the relief surface, delamination of the base layer from the relief polymer is likely. In addition, solid plates are subject to warehousing problems due to the different plate sizes and layer thicknesses required by the printing industry. Also, printing plates made from precast solid polymers are more difficult to develop and washout than photopolymer plates prepared from liquid resins. Solid plates are also subject to deterioration on storage due to migration of components and to distortions resulting from handling.

According to this invention, a process for making a printing plate having at least two distinct contiguous layers comprises exposing to actinic light, through a photographic negative, a photopolymerizable element comprising: a printing layer of a liquid photopolymerizable composition comprising at least one addition polymerizable compound having a normal boiling point above about 100° C., a molecular weight of less than about 1500 and at least one ethylenically unsaturated group capable of forming a high polymer by photoinitiated polymerization; at least one unsaturated polymeric material which is soluble in said addition polymerizable compound; at least one polymerization inhibitor; and a photoinitiator; and a base layer of a different liquid photopolymerizable composition comprising at least one addition polymerizable compound having a normal boiling point above about 100° C., a molecular weight of less than about 1500 and at least one ethylenically unsaturated group capable of forming a high polymer by photoinitiated polymerization; at least one unsaturated polymeric material which is soluble in said addition polymerizable compound; at least one polymerization inhibitor; and an amount of photoinitiator greater than that in said printing layer such that said base layer has a photopolymerization rate about 1.5 to about 250 times that of said printing layer, said printing layer and base layer compositions having differing crosslinkability such that, upon exposure, the layers have moduli differing by at least about 50 p.s.i.; and removing unpolymerized portions of said layers.

It will be understood from the above that the moduli is controlled by the crosslinkability of the different liquid photopolymerizable compositions, while the differing amounts of photoinitiator controls the shoulder angles of the photopolymer layers.

Preferably, the individual layers will be from about 1 mil to about 250 mils thick, the most preferred range for the layer used as the printing surface being generally from about 4 mils to about 150 mils. Preferably, for convenient removal of the unpolymerized parts of the layers, the photopolymerizable composition should be dispersible at a concentration of from about 1% to about 40% by weight of a solvent in which the polymerized resin is insoluble. Suitable solvents are water, aqueous base solutions or water-miscible organic solvents.

The invention contemplates a printing plate made by the above described process, in which the printing layer is doctored over a supported photographic negative that is protected by a cover film and the base layer is covered by a backing layer.

The photopolymerizable compositions used according to this invention are of such a nature that adjacent layers remain distinct entities after the curing process, yet bond together tightly enough (without the aid of an adhesive), that the layers will not separate or fracture during the printing process. The unsaturated polymeric component, hereinafter referred to as the prepolymer, is chosen from such chemical classes as polyesters, polyurethanes, polyethers, polybutadienes and polyamides, the only restriction being that the polymer be soluble in the addition polymerizable compound. Dyes and inert ultraviolet absorbers are often desirable additives to the compositions and waxes or other additives may be added to the resin, if desired.

Suitable unsaturated polymeric compositions which can be used as the prepolymers in the photopolymerizable composition include unsaturated polyesters produced from at least one polyol and at least one unsaturated dicarboxylic acid, its anhydride or its methyl or ethyl ester (see U.S. Pat. No. 3,858,510 to Kai et al); unsaturated polyester-polyether block polyurethanes such as those described in U.S. Pat. No. 3,960,572 to Ibata et al; unsaturated polyether-polyurethanes such as those described in German Pat. No. 2,641,189; polyene-polythiol compositions such as those described in U.S. Pat. No. 3,661,575 to Ketley et al; and terminally unsaturated homopolymers and copolymers of butadiene, isoprene, chloroprene, styrene, isobutylene and ethylene in which the terminal unsaturation is attached to the polymer through a combination of at least two ether, thioether, ester, keto or amide groups (see Belgian Pat. No. 847,986).

In general, the unsaturated polymeric component may be present in amounts from about 40% to about 95% by weight. Likewise, the addition polymerizable compound may be present in amounts from about 2% to about 50% by weight.

Typical ethylenically unsaturated addition polymerization compounds are acrylic acid, methacrylic acid, methyl acrylate, ethyl acrylate, n-propyl acrylate, isopropyl acrylate, n-hexyl acrylate, n-octyl acrylate, cyclohexyl acrylate, allyl acrylate, glycidyl acrylate, styrene, vinyl toluene, divinyl benzene, carboxystyrene, diallyl phthalate, triallyl cyanurate, vinyl acetate, acrylamide, methacrylamide, n-butyl acrylamide, N-methylol acrylamide, N-methylol methacrylamide, N-methoxymethyl acrylamide, N-ethoxymethyl acrylamide, N-ethoxymethyl methacrylamide, N-n-butoxymethyl acrylamide, N,N'-methylene bis acrylamide, N,N'-methylene bis methacrylamide, N,N'-trimethylene bis acrylamide, N,N'-hexamethylene bis acrylamide, methyl methacrylate, 2-hydroxyethyl acrylate, 2-hydroxyethyl methacrylate, lauryl methacrylate, 2-hydroxypropyl acrylate, 2-hydroxypropyl methacrylate, 3-chloro-2-hydroxypropyl acrylate, 4-hydroxybutyl acrylate, diethylene glycol monoacrylate, dipropylene glycol monoacrylate, polyethylene glycol monoacrylate, ethylene glycol diacrylate, tetraethylene glycol diacrylate, propylene glycol dimethacrylate, diethylene glycol dimethacrylate, triethylene glycol dimethacrylate, tetraethylene glycol dimethacrylate, polyethylene glycol dimethacrylate, trimethylolpropane triacrylae, 1,6-hexanediol dimethacrylate, N-3-oxo-propyl acrylamide, N-3-oxobutyl acrylamide, N-3-oxo-1-methylbutyl acrylamide, N-3-oxo-1-dibutyl-2-n-propylheptyl acrylamide, etc.

The composition of each individual layer must be adjusted so that the layers will have the desired relative hardness after curing. This may be accomplished by controlling the amount of crosslinking which occurs during photopolymerization, i.e., the more the polymerization product is crosslinked, the harder it will be. There are several ways to control crosslinking. The degree of unsaturation in the prepolymer can be adjusted during its preparation to provide the required number of crosslink sites. Likewise, the amount of crosslinking can be controlled by selecting addition polymerizable compounds (which act as the cross-linking agent) which have varying degrees of unsaturation or by adjusting the amount of addition polymerizable compound in the photopolymerizable composition.

In general, the individual layers of the printing plates of this invention should have moduli falling within the range of about 50 p.s.i. to about 80,000 p.s.i. In addition, the modulus of the cured upper, i.e., printing, layer polymer should be at least 50 p.s.i. higher (where a hard printing layer/soft base plate is desired) or lower (where a soft printing layer/hard base plate is desired) than the modulus of the cured underlayer, i.e., base layer, polymer.

In the description of this invention, modulus has been used to describe differences in hardness. The Young's moduli of this invention are determined by extending the initial straight section of the stress-strain curve obtained according to ASTM D-638 and dividing the slope of this load over distance by the cross-sectional area of the sample. Samples are prepared from 40 mil thick plates cured with 20 seconds back exposure with GE F-20-T-12 BL fluorescent lamps with an intensity of about 1.2 mwatts/cm.$^2$ and a relief exposure with a medium pressure 2 KW mercury arc lamp with an intensity of about 8 mwatts/cm.$^2$ for 270 seconds.

Shore hardness has also been used to describe differences in hardness. Shore hardness is determined according to ASTM D2240-75.

In some printing applications, such as printing on rough stock like corrugated boxes, burlap, paper bags, etc., it is desirable to use a printing plate having a soft upper, i.e., printing, layer and a harder underlayer. The softer upper layer polymer generally carries more ink and thus transfers more of it to the stock than do printing plates having harder surfaces. The printing plate having the soft printing surface generally prints with less "wiping" action than the hard surface plate.

It is well recognized from photopolymerization theory that the rate at which the liquid photopolymer resins used in this invention will polymerize will depend on the initiator level and type, the inhibitor level and type, the ultraviolet absorber level and type and the overall resin layer thickness. (See G. Odian, Principles of Polymerization, McGraw Hill Book Co., N.Y., N.Y., 1970, p. 183.)

The photopolymerization rate also depends on the reactivity and absorption spectrum of the resin, and correspondingly the spectral energy distribution and intensity level of the radiation source used for exposure. A reduction in shoulder formation in the upper layer (giving a high shoulder angle) is aided by absorbing less divergent or stray radiation in the areas adjacent to the image areas and by use of a resin which reacts more slowly to such divergent radiation. Such lower light absorption is achieved by using a lower concentration of photoinitiator or other light absorber in the upper resin layer. For the same reason a higher level of photoinitiator or other light absorber in the lower resin layer will result in utilization of divergent light which comes through (is not absorbed by) the upper resin or is reflected from the support sheet to cause formation of insoluble polymer over a broader area than that of the image opening (thus giving a lower shoulder angle). It should, therefore, be stressed that, in this invention, the photospeed (i.e., polymerization rate) of the upper resin is slower relative to the underlayer resin.

Acceptable initiators include benzoin; alpha-hydroxymethyl benzoin; 2,2-diethoxyacetophenone; haloalkylbenzophenones; alpha, alpha, alpha-trichloroacetophenone; ketosulfides; 2-alkoxy-1,3-diphenyl-1,3-propanedione; alkyl benzoin ethers; alpha, alpha-di-methoxyphenylacetophenone; 1-phenyl-1,2-propanedione-2,O-benzyl-oxime; S,S'-diphenylthiocarbonate; and the like. The alkyl benzoin ethers and alpha, alpha-dimethoxyphenylacetophenone are preferred initiators. Ultraviolet absorbers or dyes include acetophenone, benzophenone, thioxanthone, anthraquinone, fluorenone, benzotriazole, o-nitroaniline, and the like. Preferred ultraviolet absorbers or dyes are benzophenone and o-nitroaniline.

Thus, concurrent with the above compositional modifications used to achieve the desired moduli, the level of initiator, inhibitor, and/or ultraviolet absorber should be adjusted so that the upper resin layer (whether harder or softer than the underlayer) has a slower photospeed relative to the resin used as the underlayer. The response to ultraviolet radiation of the resin used as the underlayer can be about 1.5 to about 250 times that of the resin used as the upper layer, preferably about 5 to about 20 times that of the upper layer resin. The preferred manner of adjusting photospeed is by preadjusting the initiator level in the resin used for each layer. For initiators such as alkyl benzoin ethers or alpha, alpha-dimethoxyphenylacetophenone about 0.1% to about 1% by weight may be used in the upper (i.e. printing) layer and about 0.5% to about 2.5% by weight may be used in the underlayer. Preferably, about 0.3% to about 0.5% initiator may be used in the upper layer and about 0.8% to about 1.5% in the underlayer.

The attached drawing illustrates the effect of the above-described difference in photospeed. The FIGURE shows a cross-sectional view of a portion of a printing plate made according to this invention. By varying the photospeed balance between the resins used for the upper layer 3 and lower layer 2, printing plates can be made which have a shoulder angle b for the entire depth of the upper layer, i.e., the angle formed by the outside inclined edge of the upper layer 3 and the plane of the interface between the upper and lower layers, which is at least 10° greater than the shoulder angle a for the lower layer, i.e., the angle formed by the outside inclined edge of the lower layer 2 and the plane of the interface between the lower layer 2 and the backing sheet 1, which plane is parallel to the plane of the interface between the upper and lower layers.

The shoulder angles of the upper layer may be about 10° to about 85° (preferably about 30° to about 60°) greater than the shoulder angles of the lower layer. This is particularly advantageous in plates having hard upper layers as this structure offers a balance between print quality and plate durability which has not been demonstrated with single layer printing plates. In addition, the more open relief surface resulting from the increased shoulder angles prevents plugging by ink, lint, etc., during the printing process, thus requiring less press down-time for cleaning. Layers of the resins formulated as described above form, in a synchronous and harmonious fashion upon exposure to ultraviolet light, printing plates having integrated tailored relief elements and little or no failure due to delamination at the layer-layer interface.

The photopolymerizable compositions may also contain at least one polymerization inhibitor. Generally, the amount of inhibitor may range from about 300 parts per million to about 3000 parts per million, with about 1000 to about 2000 parts per million being preferred. Examples of useful polymerization inhibitors are di-tert-butyl p-cresol, hydroquinone monomethyl-ether, pyrogallol, quinone, phenothiazine and the like. Di-tert-butyl p-cresol is particularly preferred.

To avoid excessive mixing yet allow proper flow of the photopolymerizable compositions of each layer during the plate-making process, the viscosity of the composition for each layer should be between about 1000 cps. and about 60,000 cps. with about 5,000–30,000 cps. being preferred. There is, however, no requirement that the compositions used for each layer have the same viscosity as long as they fall within the above range. In the examples described hereinafter, all of the photopolymerizable compositions have viscosities within the above range.

Those plates having a hard upper layer and soft base layer also demonstrate superior impression and wider screen latitude. Normally, with a single layer polymer plate, as impression is increased, the printing surfaces will distort and the printed copy will be larger than the intended image areas of the printing plate. However, with the hard upper layer and soft base layer, the distortion due to impression is absorbed by the softer base layer, since the base layer is formulated and designed to compress before the harder upper polymer. Since the softer base polymer does compress, the harder upper polymer does not distort and the fidelity of the printing image is maintained over a wide range of impression. In addition, because of the tailored structure of the relief surface (due to the low initiator level) in the harder upper layer, the relief images do not begin to broaden until the softer base layer is highly compressed. In normal plates prepared from a single liquid resin, the images begin to broaden at the relief surface. Further, the layered plates do not exhibit image growth as the plate wears until the entire upper surface is worn away. Since the depth of this upper layer can be easily adjusted with the liquid system used in this invention, image growth due to plate wear can be avoided.

The layered photopolymerizable printing plates of this invention can easily be made on site in a printing plant by doctoring the liquid photopolymerizable resin which will ultimately be the upper or printing layer at the desired thickness over a polymeric film covering (and thereby protecting) a negative. The second liquid resin which will ultimately serve as the base layer is then doctored at the proper thickness over the first resin while the first resin still in a liquid state and the whole is covered with a suitable support which may, if desired, contain an adhesive. (Generally, it is desirable to use an ultraviolet transparent film as the support to make possible a secondary back exposure which provides broader shoulder angles in the base layer than can be achieved with opaque supports. These broader shoulder angles provide stronger support for the relief surface.) It should be emphasized that both resin layers remain liquid throughout the foregoing operations. It is not until the liquid layers are exposed that they solidify. Selected areas of the plate are exposed by subjecting them to ultraviolet radiation through the negative. Unpolymerized resin is then removed from those areas which were not fully exposed, i.e., those corresponding to the darker portions of the negative.

The above description simply provides one manner in which the printing plates of this invention can be made and is not intended to limit the manner in which the described plates can be prepared or the number of layers which can be used.

In the following examples all parts are by weight and each of the described photopolymerizable compositions has a viscosity between about 1,000 cps. and about 60,000 cps.

EXAMPLE 1

A Mylar backing sheet approximately 4 mils thick is coated with an adhesive solution containing a red dye as an antihalation agent.

Four to six mils of a liquid polyester I resin composition prepared by dissolving 100 parts of polyester I (prepared from 2 moles of diethylene glycol, 2 moles propylene glycol, 2 moles adipic acid and 2 moles fumaric acid) in 45 parts triethylene glycol dimethacrylate, 15 parts N-3-oxobutylacrylamide, 0.038 part of di-tertiary butyl p-cresol, 0.02 part of the methyl ether of hydroquinone, and 0.5 part benzoin isobutyl ether is doctored onto a 0.75 mil polypropylene film covering a line process negative. This polyester I resin composition, when photocured, has a hardness of 50D and a modulus of 52,503 lbs./in.$^2$. Next, 7-9 mils of a liquid polyester II resin composition prepared by dissolving 100 parts of a polyester prepared from 1 mole diethylene glycol, 1 mole propylene glycol, 0.5 mole fumaric acid, 0.5 mole phthalic anhydride, and 1 mole adipic acid in 50 parts styrene, 50 parts triethylene glycol dimethacrylate, 0.07 parts di-tert butyl p-cresol, 0.03 part methyl ether of hydroquinone and 1.8 parts benzoin isobutyl ether is doctored over the 4-6 mils of the still liquid polyester I composition. This polyester II resin composition, when photopolymerized, has a hardness of 67 A and a modulus of 1260 lb./in.$^2$ The above mentioned backing sheet is laid over the above liquid resin layers and the whole is irradiated for ten seconds through the backing sheet with GE F-20-T-12 BL fluorescent lamps (of intensity 1.2 mwatt/cm.$^2$ as measured by an Ultraviolet Back-Ray meter). The resin sandwich is then irradiated through the negative for 80 seconds with a 2000 watt medium pressure mercury arc lamp (at an intensity of 7 mwatt/cm.$^2$). After exposure, the polypropylene film is stripped away and the unexposed polymer removed by spray washing for 2 minutes with a 0.5% sodium hydroxide aqueous solution and an additional 30 seconds with water. The dry plate is exposed for 10 minutes under a nitrogen blanket with fluorescent lamps (of 1.2 mwatt/cm.$^2$ intensity). The formed plate is 17 mils thick (including the backing sheet) with a relief height of 12-13 mils, and a selected shadow area had an etch depth of 0.0067 mm. while a similar shadow area in a plate using only polyester II composition alone had an etch depth of only 0.0025 mm. In addition, a sharp relief image bonded to the base support corresponding to the clear areas in the negative is formed. The angle of a highlight element in the base layer is 58° with the horizontal while the angle of this same highlight element in the upper layer is 85° with the horizontal. The same highlight element in a plate made of only polyester II composition has an angle of 50°. The angle of the element in the layered plate changes about 4 mils below the relief surface.

The plate exhibits long press life and no image growth is observed when 10 mils impression is applied or as the plate wears. No plugging or low spots are observed, overall screen and tonal range held and printed with this plate is extended over that of nonlayered plates and overall print quality and appearance is better than that observed with nonlayered printing plates.

EXAMPLE 2

A layered plate is prepared as described in Example 1 except that 8 mils of liquid polyester I composition is doctored onto the polypropylene film followed by 10 mils of liquid polyester II formulation. The plate is exposed for 20 seconds through the backing sheet and 80 seconds through the negative. The formed 22 mil thick plate is developed in the washout solution described in Example 1 and has a relief depth of 15 mils. The bottom portion of a relief element makes an angle of 38° with the horizontal and the upper portion has an angle of 78°. The etch depth in a shadow area is 0.015 mm. This plate possesses the overall printing qualities exhibited by the plate described in Example 1.

EXAMPLE 3

A layered plate is prepared as described in Example 1 except that 4-6 mils of a liquid polyurethane I resin formulation is used as the upper layer. The polyurethane prepolymer for this resin is prepared reacting 26.1 g. of a mixture of 2,4-toluene diisocyanate and 2,6-toluene diisocyanate under nitrogen with 200 g. of polyethylene adipate diol (molecular weight approximately 450) at 70° C. with stirring in the presence of dibutyltin dilaurate for 2 hours. Then the resulting isocyanate terminated polyester urethane is further reacted with 100 g. of polypropylene glycol diol (molecular weight approximately 1000) at 70° C. for 2 hours. Then 300 g. of the resulting polyester-polyether urethane block polymer were reacted with 25 g. of 2-hydroxypropyl methacrylate containing 0.09 part of 2,6-di-t-butyl-p-cresol as stabilizer at 70° C. for 2 hours under an air sparge. 70 parts of this prepolymer is then added to 12 parts of 2-hydroxypropyl methacrylate, 16 parts n-butyl acrylamide, 2 parts acrylamide, 0.04 part di-tert butyl p-cresol, 0.04 part hydroquinone methyl ether and 0.3 part alpha, alpha-dimethoxyphenyl-acetophenone. This polyurethane I resin composition, when photocured, has a hardness of 70 A and a modulus of 920 lb./in.$^2$. A 7-9 mil layer of liquid polyester II composition in Example 1 is doctored over a 4-6 mil layer of the still liquid polyurethane I formulation and given a back exposure of 12 seconds and a relief exposure of 120 seconds. The 17 mil plate with a 13 mil relief is developed as described in Example 1 and a relief highlight element has an angle of 48° in the base layer and 82° in the upper layer. The etch depth of a shadow area is 0.0083 mm. This plate has the overall print quality advantages of the plate described in Example 1 with the added advantages of better abrasion resistance of the polyurethane composition polymer than when the polyester polymer composition is used on the relief surface.

EXAMPLE 4

A layer of 5-8 mils of liquid polyurethane I composition described in Example 3 containing 0.5 part alpha, alpha-dimethoxyphenylacetophenone instead of 0.3 part is doctored over polypropylene film covering a test negative containing a Bychrome screen tint. Over this, a 50-53 mil layer of liquid polyurethane II formulation which is prepared as described in Example 3 by adding 70 parts of a polyurethane prepolymer (prepared from 37.65 parts polyethylene adipate diol, 34.97 parts polypropyleneglycol diol, 7.31 parts of 2,4-toluene diisocyanate and 2,6-toluene diisocyanate in an 80:20 mixture and capped with 17.75 parts polyethylene glycol monomethacrylate having an average degree of polymerization of 7) to 12 parts n-butyl acrylamide, 12 parts of 2-hydroxyethyl methacrylate, 2.0 parts acrylamide, 5.0 parts styrene, 0.05 part di-tert-butyl p-cresol, and 1.0 part benzoin isobutyl ether. The photocured polymer from this resin has a hardness of 40 A and a modulus of 220 lb./in.$^2$. The plate is formed by exposing the liquid resin layers through a backing sheet prepared as described in Example 1 without the antihalation dye for 55 seconds and through the negative for 180 seconds.

EXAMPLE 5

A layered plate is prepared by using the backing sheet described in Example 1 without the red antihalation material and by doctoring 5-8 mils of liquid polyurethane I composition described in Example 3 containing 0.1 part alpha, alpha-dimethoxyphenylacetophenone instead of 0.3 part over 50-53 mils liquid polyurethane III composition which is prepared by adding 76.52 parts of the prepolymer used for polyurethane II composition in Example 4 to 9.98 parts lauryl methacrylate, 1.60 parts 2-hydroxyethyl methacrylate, 10.64 parts of polyethylene glycol dimethacrylate, 0.04 part di-tert-butyl p-cresol, 0.04 part hydroquinone methyl ether and 1 part benzoin isobutyl ether. This polyurethane III resin composition, when photocured, has a hardness of 22 A and a modulus of 150 lb./in.$^2$. The plate is formed by exposing through the backing sheet for 80 seconds and through the Bychrome screen test negative for 180 seconds. The 62 mil thick plate with 30 mils relief, tailored relief printing elements and open etch depth is developed and post exposed as described in Example 1.

EXAMPLE 6

125 Mils of liquid polyurethane IV formulation, which yields a photocured polymer of 90 A hardness and a modulus of 10,000 lbs./in.$^2$ and is prepared by adding 70 parts of the prepolymer used to prepare polyurethane I composition described in Example 3 to 10 parts triethylene glycol dimethacrylate, 16 parts n-butyl acrylamide, 4 parts methyl methacrylate, 0.3 part hydroquinone methyl ether, 0.3 part di-tert-butyl p-cresol, and 0.3 part alpha, alpha-dimethoxyphenacetophenone is doctored over a polyester film covering a line process negative. A 125 mil layer of liquid polyurethane V composition, which yields a photocured polymer having a hardness of 35 A and a modulus of 171 and is prepared by adding 70 parts of the prepolymer used to prepare polyurethane II composition described in Example 4 (except that the prepolymer was capped with a polyethylene glycol monomethacrylate having an average degree of polymerization of 15 instead of 7) to 12 parts 2-hydroxyethyl methacrylate, 12 parts n-butyl acrylamide, 2 parts acrylamide, 5 parts styrene, 0.05 hydroquinone methyl ether, 0.05 part di-tert-butyl p-cresol, and 0.3 part alpha, alpha-dimethoxyphenylacetophenone, is doctored over the liquid polyurethane IV formulation layer and the backing sheet described in Example 1 without the red antihalation dye is applied. The plate is hardened by exposing through the backing sheet for 2.5 minutes and through the negative for 7 minutes. The 250 mil plate having 125 mil relief is developed as described above and has strong tailored relief elements.

EXAMPLE 7

To 100 parts of a carboxyl terminated polybutadiene (Hycar CTB-2000X162-B. F. Goodrich) are added 6.7 parts of glycidyl methacrylate, 0.015 part phenothiazine, (0.0075 part nitrobenzene, 0.08% sodium methoxide) and 0.20 part di-tert-butyl p-cresol. This mixture is heated under a stream of air at 100° C. until an acid number of 0.36 is obtained. Eighty-eight parts of this prepolymer are added to 6 parts 1,6-hexanediol dimethacrylate, 6 parts lauryl methacrylate and 0.6 part alpha, alpha-diethoxyacetophenone which gives a photocured polymer having a hardness of 55 A and a modulus of 600 lb./in.$^2$. A layer of 5–15 mils of this liquid polybutadiene I resin composition is doctored over a polypropylene film covering a line process negative and a 80–90 mil layer of liquid polyurethane II composition, which when cured has a hardness of 40 A and modulus of 220 lb./in., is doctored over the polybutadiene I resin formulation. The plate is hardened by exposing through the backing sheet of Example 1 (containing no antihalation dye) for 2 minutes and exposing through the negative for 5 minutes. The plate is developed by spray washing with a warm (50° C.) solution of 1.0% Bioterge alpha-olefin sulfonate detergent (Stepon Chem. Co.) and post-exposed under a nitrogen blanket for 10 minutes. This 90–95 mil thick plate with 45 mils relief has the overall printing qualities of the plates in the previous examples, plus the advantage of being resistant to alcohol inks and solvents.

EXAMPLE 8

Four to five mils of liquid polyester I composition in Example 1 is doctored over a film covering a Bychrome screen negative. Then 8–9 mils of a liquid photopolymer resin containing 38.5 parts of the prepolymer used for polyester II composition in Example 1 and 41.08 parts of the prepolymer used to prepare polyurethane I composition in Example 3, both dissolved in 16 parts n-butyl acrylamide, 12 parts 2-hydroxyethyl methacrylate, 5 parts styrene, 2 parts acrylamide, 0.04 part di-tert-butyl p-cresol, 0.04 part methyl ether of hydroquinone, 0.65 part benzoin isobutyl ether, and 0.55 part alpha, alpha-dimethoxyphenylacetophenone (which yields a polymer of hardness of 61 A and 760 modulus when photocured) is doctored over the polyester I resin composition layer. This plate is hardened by exposing through the backing sheet described in Example 1 for 10 seconds and through the negative for 80 seconds. The plate is developed as described in Example 1 and has the tailored relief elements characteristic of the plates described in this invention.

EXAMPLE 9

A 125 mil layer of liquid polyurethane III composition described in Example 5 having a cured hardness of 22 A and a modulus of 150 lb./in.$^2$ is doctored over a polypropylene film covering a production type negative for printing corrugated boxes. A 125 mil layer of liquid polyurethane VI composition, which yields a photocured polymer having a hardness of 50 A and modulus of 420 p.s.i. and is prepared by adding 70 parts of the prepolymer used to prepare polyurethane II composition described in Example 4 to 12 parts n-butyl acrylamide, 6 parts 2-hydroxyethyl methacrylate, 6 parts tetraethylene glycol dimethacrylate, and 2 parts styrene, 0.05 parts hydroquinone methyl ether, 0.05 di-tert-butyl p-cresol, and 0.3 part alpha, alpha-dimethoxyphenylacetophenone, is doctored over the polyurethane III formulation layer and a backing sheet described in Example 1 (without the red antihalation dye) is applied. The plate is cured by exposing through the backing sheet for 2.5 minutes and through the negative for 5 minutes. The 250 mil plate having 125 mil relief is developed as described above and has strong tailored relief elements. This printing plate is used to print corrugated boxes. Solid areas with this plate have better ink coverage than plates printed with a 250 mil plate of polyurethane III composition alone (i.e., not a two layered plate).

EXAMPLE 10

Into a 2 liter resin kettle equipped with a stirrer, a thermometer and a gas inlet and outlet tubes are charged 1313 g. (0.745 equivalents, acid no. 31.9) of a carboxyl terminated copolymer of butadiene and acrylonitrile, containing 10% acrylonitrile. 77.8 g. (0.48 equivalents) of the diglycidyl ether of Bisphenol A and 3.3 g. of N,N-dimethylbenzylamine. The reaction mixture is maintained under a nitrogen atmosphere at 100° C. for 7 hours. The acid number is 9.4. Dry air is sparged through the reaction mixture for 20 minutes and a solution of 58.3 g. of glycidyl methacrylate, 3.9 g. of butylated hydroxy toluene and 0.078 g. of phenothiazine is added to the reactor. The flask is maintained at 100° C. for an additional hour and then cooled. The product, polybutadiene I, has an acid number of 2.7 and a Brookfield viscosity of 700,000 cps. at 25° C.

A photosensitive composition is prepared by blending 256 g. of polybutadiene I with 80 g. of lauryl methacrylate, 64 g. of 1,3-butylene glycol dimethylacrylate and 2.4 g. of 2,2-dimethoxy-2-phenyl acetophenone at 40° C. until a homogeneous solution is obtained. After photocuring, the resin has a tensile strength of 880 psi, an elongation of 120%, a tensile modulus of 644 psi and a Shore A hardness of 55. When a sample of this cured resin is immersed in a solution of 90% ethyl alcohol and 10% propyl acetate for 24 hours, it increases only 13% in weight.

A layer of 5-15 mils of this liquid polybutadiene I based resin composition is doctored over a polypropylene film covering a line process negative and a 80-90 mil layer of liquid polyurethane II composition, which, when cured, has a hardness of 40 A and a modulus of 220 lbs./in., is doctored over the polybutadiene I resin formulation. The plate is hardened by exposing through the backing sheet of Example 1 (containing no antihalation dye) for 2 minutes and exposing through the negative for 5 minutes. The plate is spray washed with a warm (50° C.) solution of 1.0% Bioterge alpha-olefin sulfonate detergent (Stepon Chem. Co.) and post-exposed under a nitrogen blanket for 10 minutes. This 90-95 mil thick plate with 45 mils relief has the overall printing qualities of the plates in the previous examples, plus the advantage of being resistant to alcohol inks and solvents. It showed exceptional resistance to delamination (separation of the resin layers) on extended use of the printing plate.

What we claim and desire to protect by Letters Patent is:

1. The process of making a printing plate which comprises exposing to actinic light, through a photographic negative, a photopolymerizable element comprising: a printing layer of a liquid photopolymerizable composition comprising at least one addition polymerizable compound having a normal boiling point above about 100° C., a molecular weight of less than about 1500 and at least one ethylenically unsaturated group capable of forming a high polymer by photoinitiated polymerization; at least one unsaturated polymeric material which is soluble in said addition polymerizable compound; at least one polymerization inhibitor; and a photoinitiator; and a base layer of a different liquid photopolymerizable composition comprising at least one addition polymerizable compound having a normal boiling point above about 100° C., a molecular weight of less than about 1500 and at least one ethylenically unsaturated group capable of forming a high polymer by photoinitiated polymerization; at least one unsaturated polymeric material which is soluble in said addition polymerizable compound; at least one polymerization inhibitor; and an amount of photoinitiator greater than that in said printing layer such that said base layer has a photopolymerization rate about 1.5 to about 250 times that of said printing layer, said printing layer and base layer compositions having differing crosslinkability such that, upon exposure, the layers have moduli differing by at least about 50 p.s.i.; and removing unpolymerized portions of said layers.

2. The process of claim 1 wherein the unsaturated polymeric material is selected from the group consisting of unsaturated polyesters; unsaturated polyester-polyether block polyurethanes, unsaturated polyether-polyurethanes; and terminally unsaturated homopolymers and copolymers of butadiene, isoprene, chloroprene, styrene, isobutylene, and ethylene.

3. The process of claim 1 wherein the photoinitiator is selected from the group consisting of alkyl benzoin ethers and alpha, alpha-dimethoxyphenylacetophenone.

4. The process of claim 3 wherein the printing layer contains about 0.1% to about 1% by weight and the base layer contains about 0.5% to about 2.5% by weight of photoinitiator.

5. The process of claim 1 in which the modulus of the printing layer is higher than the modulus of the base layer.

6. The process of claim 1 in which the modulus of the base layer is higher than the modulus of the printing layer.

7. The process of claim 1 wherein the unsaturated polymeric material is a terminally unsaturated copolymer of butadiene and acrylonitrile.

* * * * *